US012787621B2

(12) United States Patent
Lee et al.

(10) Patent No.: US 12,787,621 B2
(45) Date of Patent: Nov. 3, 2026

(54) LIGHT EMITTING DISPLAY APPARATUS

(71) Applicant: LG Display Co., Ltd., Seoul (KR)

(72) Inventors: HwanKeon Lee, Paju-si (KR); Jungeun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 183 days.

(21) Appl. No.: 18/933,431

(22) Filed: Oct. 31, 2024

(65) Prior Publication Data

US 2025/0275450 A1 Aug. 28, 2025

(30) Foreign Application Priority Data

Feb. 26, 2024 (KR) ........................ 10-2024-0027137

(51) Int. Cl.

| | |
|---|---|
| ***H10K 59/38*** | (2023.01) |
| ***G06F 3/041*** | (2006.01) |
| ***H10H 20/84*** | (2025.01) |
| ***H10K 50/86*** | (2023.01) |
| ***H10K 59/40*** | (2023.01) |
| ***H10K 59/80*** | (2023.01) |
| *G06F 3/044* | (2006.01) |
| *G09G 3/32* | (2016.01) |

(52) U.S. Cl.

CPC ....... *H10K 59/8792* (2023.02); *G06F 3/0412* (2013.01); *H10K 59/873* (2023.02); *G06F 3/0443* (2019.05); *G06F 3/0446* (2019.05); *G06F 2203/04111* (2013.01); *G09G 3/32* (2013.01); *G09G 2300/0842* (2013.01); *G09G 2354/00* (2013.01)

(58) Field of Classification Search

CPC .... G06F 3/0412; H10K 59/38; H10K 59/122; H10K 59/35

See application file for complete search history.

(56) References Cited

U.S. PATENT DOCUMENTS

2014/0042396 A1 2/2014 Yang et al.
2023/0037592 A1* 2/2023 Huang ................. H10K 59/122

FOREIGN PATENT DOCUMENTS

KR 10-1480928 B1 1/2015
KR 10-2267685 B1 6/2021
KR 10-2022-0015065 A 2/2022

* cited by examiner

*Primary Examiner* — Joseph L Williams

(74) *Attorney, Agent, or Firm* — Morgan, Lewis & Bockius LLP

(57) ABSTRACT

An aspect of the present disclosure is to provide a light emitting display apparatus in which a polarization replacement layer capable of performing functions of color filters is provided at an upper end of an array layer. The light emitting display apparatus includes an array layer including a display area in which color light is output and a non-display area surrounding the display area and a color filter layer provided on the array layer and transmitting color light transmitted from the array layer, wherein the color filter layer includes: a buffer provided on the array layer, a first dam provided on the buffer and provided outside a color display area corresponding to the display area, a polarization replacement layer provided inside the first dam, and a black matrix provided on the polarization replacement layer and provided in an area corresponding to a bank provided in the array layer.

21 Claims, 9 Drawing Sheets

LIGHT EMITTING DISPLAY APPARATUS

CROSS-REFERENCE TO RELATED APPLICATIONS

This application claims the benefit of the Republic of Korea Patent Application No. 10-2024-0027137 filed on Feb. 26, 2024, which is hereby incorporated by reference in its entirety.

BACKGROUND

Technical Field

The present disclosure relates to a light emitting display apparatus.

Discussion of the Related Art

Light emitting display apparatuses are mounted on or provided in electronic products such as televisions, monitors, notebook computers, smart phones, tablet computers, electronic pads, wearable devices, watch phones, portable information devices, navigation devices, or vehicle control display devices, etc., to display images. Pixels are provided in a light emitting display panel configuring a light emitting display apparatus and light emitting devices are provided in each of the pixels.

A color filter can be provided on light emitting devices in a light emitting display panel. In order to provide a color filter on the light emitting devices, a plurality of mask processes should be added.

Accordingly, the manufacturing process of the light emitting display apparatus can be complicated, and the price of the light emitting display apparatus can be increased.

The above-described background is part of the present disclosure to devise the present disclosure or is technical information acquired by a process of devising the present disclosure, but cannot be regarded as the known art disclosed to the general public before the present disclosure is disclosed.

SUMMARY

Accordingly, embodiments of the present disclosure are directed to providing a light emitting display apparatus that substantially obviates one or more problems due to limitations and disadvantages of the related art.

An aspect of the present disclosure is to provide a light emitting display apparatus in which a polarization replacement layer capable of performing functions of color filters is provided at an upper end of an array layer.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display apparatus comprises an array layer including a display area in which color light is output and a non-display area surrounding the display area and a color filter layer provided on the array layer and transmitting color light transmitted from the array layer, wherein the color filter layer includes: a buffer provided on the array layer, a first dam provided on the buffer and provided outside a color display area corresponding to the display area, a polarization replacement layer provided inside the first dam, and a black matrix provided on the polarization replacement layer and provided in an area corresponding to a bank provided in the array layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
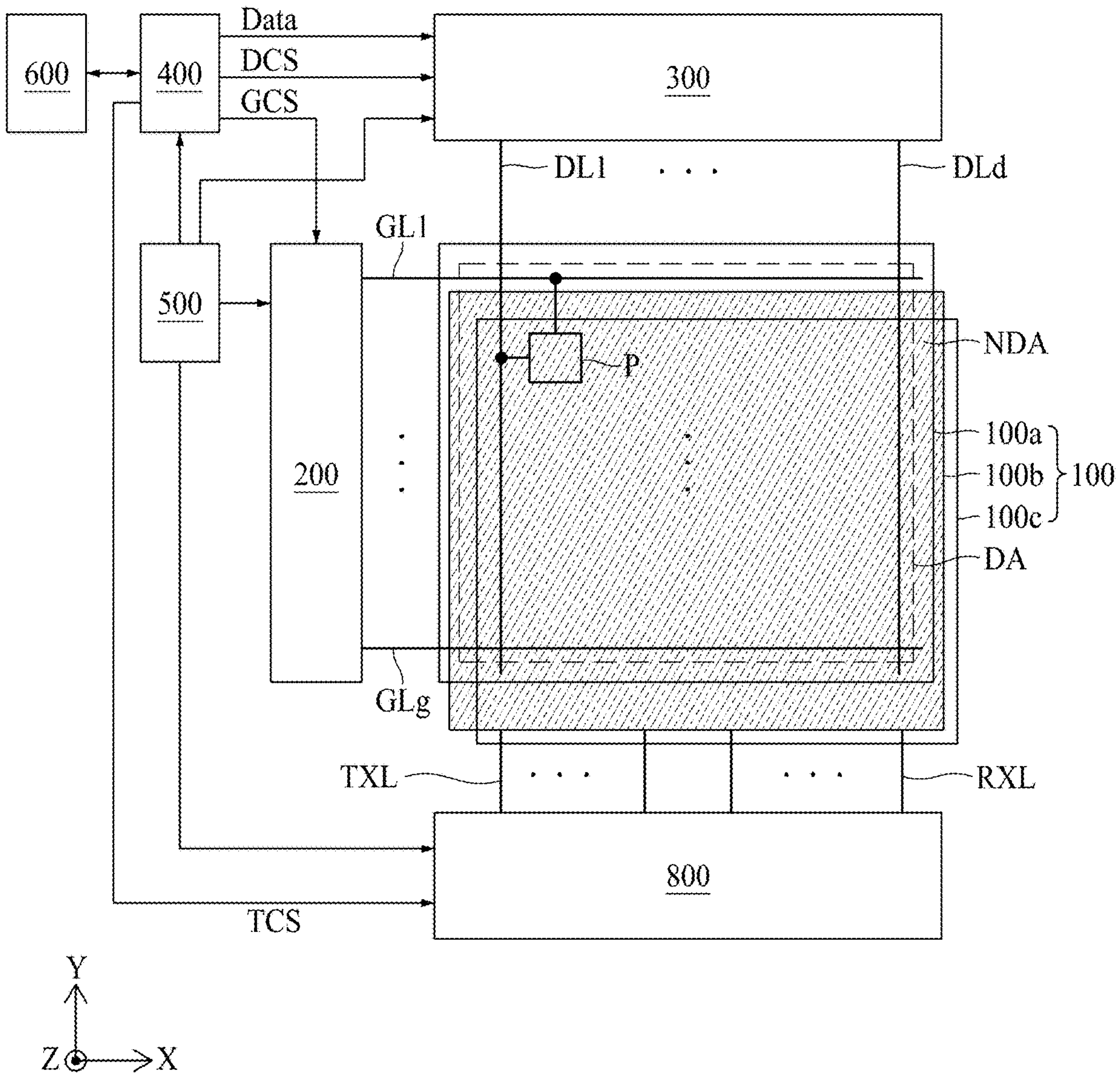
FIG. 1 is an exemplary diagram illustrating a configuration of a light emitting display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When “comprise,” “have,” and “include” described in the present disclosure are used, another part can be added unless “only” is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, “on,” “over,” “under,” and “next,” one or more other parts can be disposed between the two parts unless a more limiting term, such as “just” or “direct(ly)” is used.

In describing a time relationship, for example, when the temporal order is described as, for example, “after,” “subsequent,” “next,” and “before,” a case that is not continuous can be included unless a more limiting term, such as “just,” “immediate(ly),” or “direct(ly)” is used.

It will be understood that, although the terms “first,” “second,” etc. can be used herein to describe various elements, these elements should not be limited by these terms. These terms are only used to distinguish one element from another and may not define order or sequence. For example, a first element could be termed a second element, and, similarly, a second element could be termed a first element, without departing from the scope of the present disclosure.

In describing elements of the present disclosure, the terms “first,” “second,” “A,” “B,” “(a),” “(b),” etc. can be used. These terms are intended to identify the corresponding elements from the other elements, and basis, order, or number of the corresponding elements should not be limited by these terms. The expression that an element or layer is “connected,” “coupled,” or “adhered” to another element or layer should be understood the element or layer cannot only be directly connected or adhered to another element or layer, but also be indirectly connected or adhered to another element or layer with one or more intervening elements or layers “disposed,” or “interposed” between the elements or layers, unless otherwise specified.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as the first item, the second item, or the third item. Also, the term “can” used herein includes all meanings and definitions of the word “may.”

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings.

Figure 2:
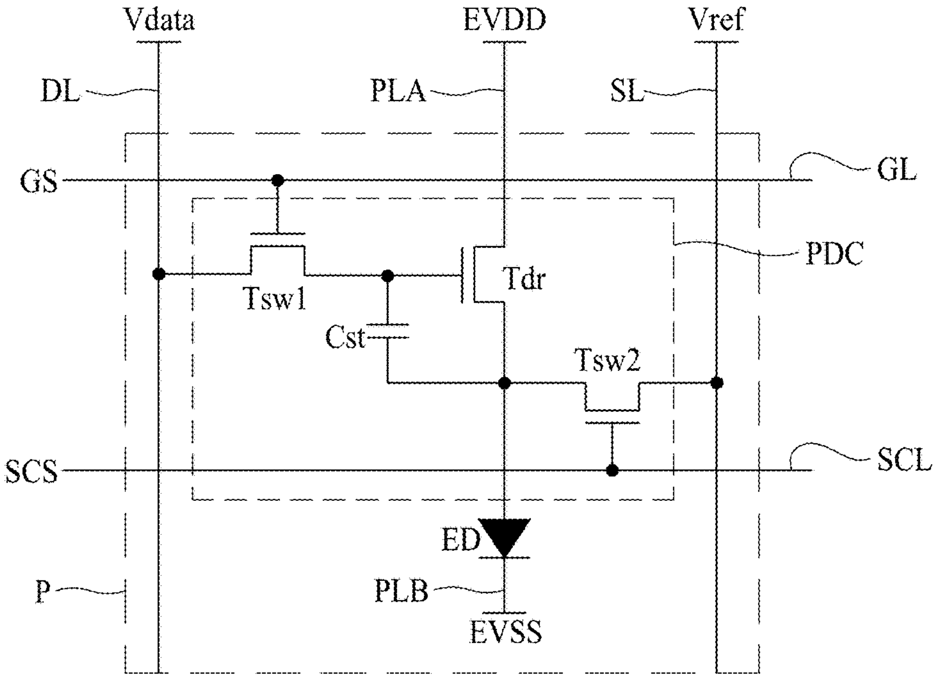
FIG. 2 is an exemplary diagram illustrating a structure of a pixel applied to a light emitting display apparatus according to an embodiment of the present disclosure.
Figure 3:
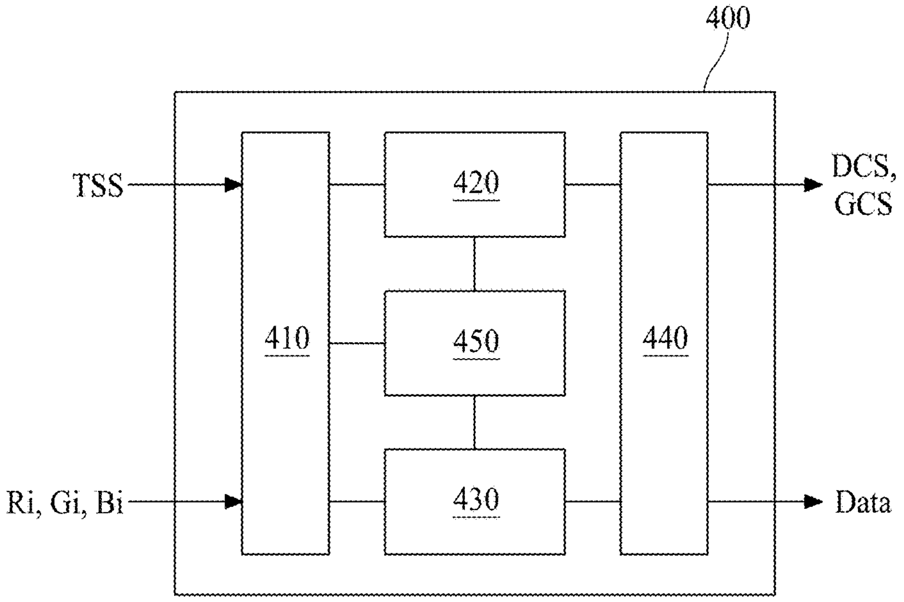
FIG. 3 is an exemplary diagram illustrating a structure of a control driver applied to a light emitting display apparatus according to an embodiment of the present disclosure.
Figure 4:
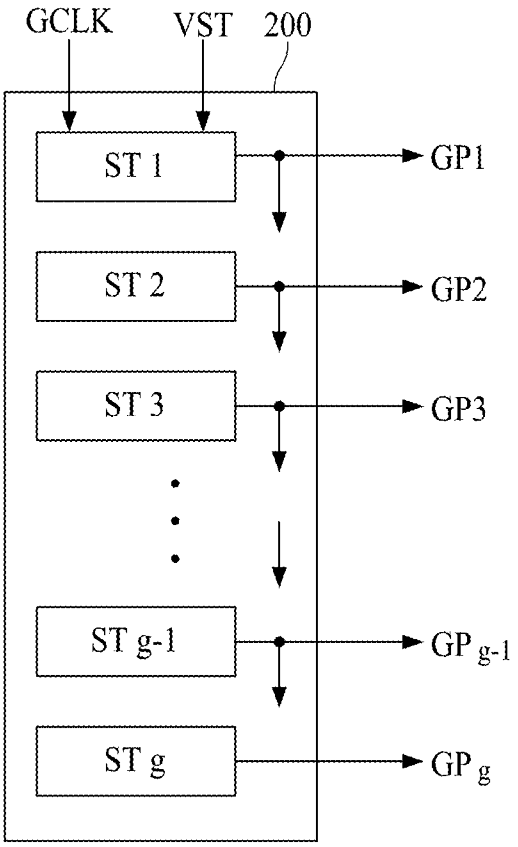
FIG. 4 is an exemplary diagram illustrating a structure of a gate driver applied to a light emitting display apparatus according to an embodiment of the present disclosure.
Figure 5:
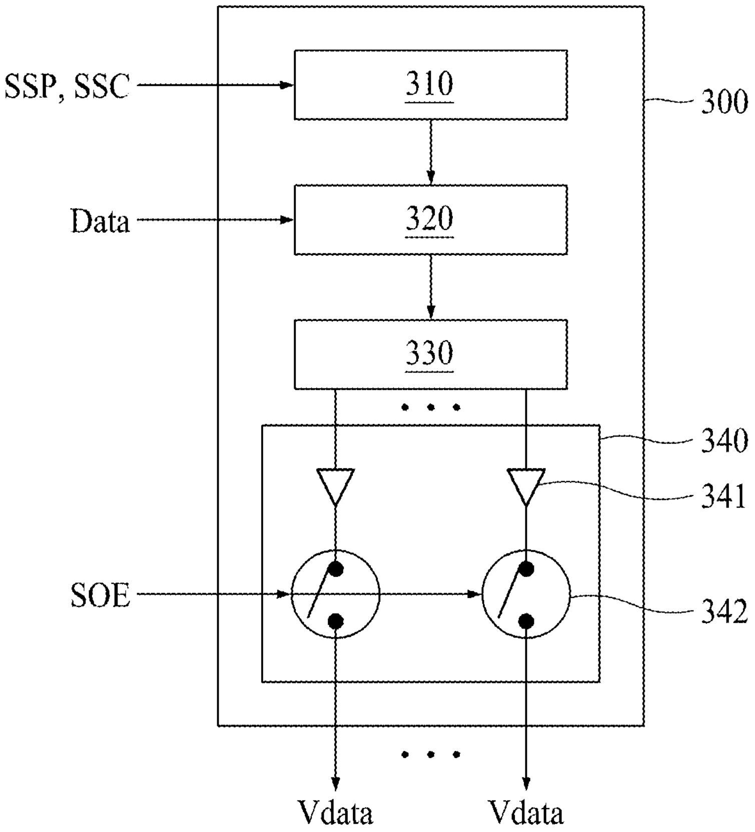
FIG. 5 is an exemplary diagram illustrating a structure of a data driver applied to a light emitting display apparatus according to an embodiment of the present disclosure.

FIG. 1 is an exemplary diagram illustrating a configuration of a light emitting display apparatus according to an embodiment of the present disclosure, FIG. 2 is an exemplary diagram illustrating a structure of a pixel applied to a light emitting display apparatus according to an embodiment of the present disclosure, FIG. 3 is an exemplary diagram illustrating a structure of a control driver applied to a light emitting display apparatus according to an embodiment of the present disclosure, FIG. 4 is an exemplary diagram illustrating a structure of a gate driver applied to a light emitting display apparatus according to an embodiment of the present disclosure, and FIG. 5 is an exemplary diagram illustrating a structure of a data driver applied to a light emitting display apparatus according to an embodiment of the present disclosure.

A light emitting display apparatus according to an embodiment of the present disclosure can be used as various kinds of electronic devices. Electronic devices can be, for example, televisions, monitors, etc.

A light emitting display apparatus according to an embodiment of the present disclosure, as illustrated in FIG. 1, can include a light emitting display panel 100 which includes a display area DA displaying an image and a non-display area NDA provided outside the display area DA, a gate driver 200 which supplies gate signals GS to a plurality of gate lines GL1 to GLg provided in the display area DA of the light emitting display panel 100, a data driver 300 which supplies data voltages Vdata to a plurality of data lines DL1 to DLd provided in the display area DA of the light emitting display panel 100, a touch driver 800 which supplies touch driving signals to touch electrodes provided in the light emitting display panel 100, a control driver 400 which controls driving of the gate driver 200, the data driver 300, and the touch driver 800, and a power supply unit 500 which supplies power to the control driver 400, the gate driver 200, the data driver 300, the touch driver 800, and the light emitting display panel 100.

First, the light emitting display panel 100 includes an array layer **100*a* on which an image is displayed, a touch electrode layer 100*b* provided with touch electrodes for sensing a touch, and a color filter layer 100*c* that transmits color light transmitted from the array layer 100*a***.

The array layer **100*a* can include a display area DA and a non-display area NDA. Gate lines GL1 to GLg, data lines DL1** to DLd, and pixels P can be provided in the display area DA. Accordingly, an image can be displayed in the display area DA. Here, g and d are natural numbers. The non-display area NDA can surround the outer periphery of the display area DA.

The pixel P included in the array layer **100*a*, as illustrated in FIG. 2, can include a pixel driving circuit PDC which includes a switching transistor Tsw1, a storage capacitor Cst, a driving transistor Tdr, and a sensing transistor Tsw2**, and a light emitting device ED connected to the pixel driving circuit PDC.

A first terminal of the driving transistor Tdr can be connected to a first voltage supply line through which a first voltage EVDD is supplied, and a second terminal of the driving transistor Tdr can be connected to the light emitting device ED.

A first terminal of the switching transistor Tsw1 can be connected to a data line DL, a second terminal of the switching transistor Tsw1 can be connected to a gate of the driving transistor Tdr, and a gate of the switching transistor Tsw1 can be connected to a gate line GL.

A data voltage Vdata can be supplied through the data line DL from the data driver 300. A gate signal GS can be supplied through the gate line GL from the gate driver 200. The gate signal GS can include a gate pulse GP for turning on the switching transistor Tsw1 and a gate-off signal for turning off the switching transistor Tsw1.

The sensing transistor Tsw2 can be provided for measuring a threshold voltage of the driving transistor Tdr or mobility of an electrical charge (for example, an electron), or supplying a reference voltage Vref to the pixel driving circuit PDC. A first terminal of the sensing transistor Tsw2 can be connected to the second terminal of the driving transistor Tdr and the light emitting device ED, a second terminal of the sensing transistor Tsw2 can be connected to a sensing line SL through which the reference voltage Vref is supplied, and a gate of the sensing transistor Tsw2 can be connected to a sensing control line SCL through which a sensing control signal SCS is supplied.

The sensing line SL can be connected to the data driver 300 and can be connected to the power supply unit 500 through the data driver 300. For example, the reference voltage Vref supplied from the power supply unit 500 can be supplied to the pixels through the sensing line SL, sensing signals transmitted from the pixels P can be converted into digital sensing signals in the data driver 300, and the digital sensing signals can be transmitted to the control driver 400.

The light emitting device ED can include a first electrode supplied with a first voltage EVDD through the driving transistor Tdr, a second electrode connected to a second voltage supply line PLB through which a second voltage EVSS is supplied, and a light emitting layer provided between the first electrode and the second electrode. The first electrode can be an anode and the second electrode can be a cathode.

The structure of the pixel P applied to a light emitting display apparatus according to an embodiment of the present disclosure is not limited to the structure illustrated in FIG. 2. Accordingly, the structure of the pixel P can be changed to various shapes.

The light emitting device ED applied to a light emitting display apparatus according to an embodiment of the present disclosure can output a first color light, a second color light, or a third color light.

Accordingly, each of the pixels P provided in the array layer 100*a* can output the first color light, the second color light, or the third color light.

For example, the first color light can be a red light, the second color light can be a green light, and the third color light can be a blue light. However, the light emitting display apparatus according to an embodiment of the present disclosure is not limited thereto.

Hereinafter, for convenience of description, a light emitting display apparatus according to an embodiment of the present disclosure will be described by using an example in which the first color light is red light, the second color light is green light, and the third color light is blue light. In this case, the red light can be output from a light emitting device ED provided in a red pixel, the green light can be output from a light emitting device ED provided in a green pixel, and the blue light can be output from a light emitting device ED provided in a blue pixel.

In this case, the color filter layer 100*c* can transmit red light transmitted from the red pixel, green light transmitted from the green pixel, and blue light transmitted from the blue pixel. In particular, the transmissive function as described above can be performed by a polarization replacement layer provided in the color filter layer 100*c*.

The touch electrode layer 100*b* performs a function of sensing a touch, and for this purpose, the touch electrode layer 100*b* can include touch electrodes.

The touch electrode layer 100*b* can be disposed between the array layer 100*a* and the color filter layer 100*c*.

When the touch electrode layer 100*b* uses a mutual capacitance method, touch driving electrodes and touch receiving electrodes can be provided in the touch electrode layer.

In this case, each of the touch driving electrodes can include at least one touch electrode, and each of the touch receiving electrodes can include at least one touch electrode. When the touch electrode layer 100*b* uses the self-capacitance method, the touch electrode layer 100*b* can include touch electrodes that are driven independently of each other.

Hereinafter, for convenience of description, a touch electrode layer using a mutual capacitance method is described as an example of a touch electrode layer 100*b* applied to a light emitting display apparatus according to an embodiment of the present disclosure.

In the touch electrode layer 100*b* using the mutual capacitance method, the touch driving electrodes can be connected to the touch driver 800 through touch driving electrode lines TXL, and the touch receiving electrodes can be connected to the touch driver 800 through touch receiving electrode lines RXL.

The control driver 400 can realign input image data Ri, Gi, and Bi transmitted from an external system 600 by using a timing synchronization signal TSS transmitted from the external system and can generate a data control signal DCS which is to be supplied to the data driver 300 and a gate control signal GCS which is to be supplied to the gate driver 200.

To this end, as illustrated in FIG. 3, the control driver 400 can include a data aligner 430 which realigns input image data Ri, Gi, and Bi to generate image data Data, a control signal generator 420 which generates the gate control signal GCS and the data control signal DCS by using the timing synchronization signal TSS, an input unit 410 which transmits the timing synchronization signal TSS transmitted from the external system 600 to the control signal generator 420 and transmits the input image data Ri, Gi, and Bi transmitted from the external system 600 to the data aligner 430, and an output unit 440 which supplies the data driver 300 with the image data Data generated by the data aligner 430 and the data control signal DCS generated by the control signal generator 420 and supplies the gate driver 200 with the gate control signal GCS generated by the control signal generator 420.

The control signal generator 420 can generate a power control signal supplied to the power supply unit 500.

The control signal generator 420 can generate a touch control signal TCS supplied to the touch driver 800.

The control driver 400 can further include a storage unit for storing various information. The storage unit 450 can be included in the control driver 400 as illustrated in FIG. 3, but can be separated from the control driver 400 and provided independently.

The external system 600 can perform a function of driving the control driver 400 and an electronic device.

For example, when the electronic device is a television (TV), the external system 600 can receive various kinds of sound information and image information over a communication network and can transmit the received image information to the control driver 400. For example, the external system 600 can convert the image information into input image data Ri, Gi, and Bi and transmit the input image data Ri, Gi, and Bi to the control driver 400.

The power supply unit 500 can generate various powers and supply the generated powers to the control driver 400, the gate driver 200, the data driver 300, the touch driver 800, and the array layer 100*a*.

The gate driver 200 can be directly embedded into the non-display area NDA by using a gate-in panel (GIP) type, or the gate driver 200 can be provided in the display area DA in which light emitting devices ED are provided, or the gate driver 200 can be provided on a chip on film mounted in the non-display area NDA.

The gate driver 200 can supply gate pulses GP1 to GPg to the gate lines GL1 to GLg.

When a gate pulse GP generated by the gate driver 200 is supplied to a gate of the switching transistor Tsw1 included in the pixel P, the switching transistor Tsw1 can be turned on. When the switching transistor Tsw1 is turned on, data voltage Vdata supplied through a data line DL can be supplied to the pixel P.

When a gate-off signal generated by the gate driver 200 is supplied to the switching transistor Tsw1, the switching transistor Tsw1 can be turned off. When the switching transistor Tsw1 is turned off, a data voltage cannot be supplied to the pixel P any longer.

The gate signal GS supplied to the gate line GL can include the gate pulse GP and the gate-off signal.

To supply gate pulses GP1 to GPg to gate lines GL1 to GLg, the gate driver 200, as illustrated in FIG. 4, can include stages ST1 to STg connected to gate lines GL1 to GLg.

Each of the stages ST1 to STg can be connected to one gate line GL, but can be connected to at least two gate lines GL.

In order to generate gate pulses GP1 to GPg, a gate start signal VST and at least one gate clock GCLK which are generated by the control signal generator 420 can be transferred to the gate driver 200. For example, the gate start signal VST and the at least one gate clock GCLK can be included in the gate control signal GCS.

One of the stages ST1 to STg can be driven by a gate start signal VST to output a gate pulse GP to a gate line GL. The gate pulse GP can be generated by a gate clock GCLK.

At least one of signals output from a stage ST where a gate pulse is output can be supplied to another stage ST to drive another stage ST. Accordingly, a gate pulse can be output in another stage ST.

For example, the stages ST can be driven sequentially to sequentially supply the gate pulses GP to the gate lines GL.

The data driver 300 can supply data voltages Vdata to the data lines DL1 to DLd.

To this end, the data driver 300, as illustrated in FIG. 5, can include a shift register 310 which outputs a sampling signal, a latch 320 which latches image data Data received from the control driver 400, a digital-to-analog converter 330 which converts the image data Data, transmitted from the latch 320, into a data voltage Vdata and outputs the data voltage Vdata, and an output buffer 340 which outputs the data voltage, transmitted from the digital-to-analog converter 330, to the data line DL on the basis of a source output enable signal SOE.

The shift register 310 can output the sampling signal by using the data control signal DCS received from the control signal generator 420. For example, the data control signals DCS transmitted to the shift register 310 can include a source start pulse SSP and a source shift clock signal SSC.

The latch 320 can latch image data Data sequentially received from the control driver 400, and then output the image data Data to the digital-to-analog converter 330 at the same time on the basis of the sampling signal.

The digital-to-analog converter 330 can convert the image data Data transmitted from the latch 320 into data voltages Vdata and output the data voltages Vdata.

The output buffer 340 can simultaneously output the data voltages Vdata transmitted from the digital-to-analog converter 330 to data lines DL1 to DLd of the light emitting display panel 100 on the basis of the source output enable signal SOE transmitted from the control signal generator 420.

To this end, the output buffer 340 can include a buffer 341 which stores the data voltage Vdata transmitted from the digital-to-analog converter 330 and a switch 342 which outputs the data voltage Vdata stored in the buffer 341 to the data line DL on the basis of the source output enable signal SOE.

For example, when the switches 342 are turned on based on the source output enable signal SOE simultaneously supplied to the switches 342, the data voltages Vdata stored in the buffers 341 can be supplied to the data lines DL1 to DLd through the switches 342.

The data voltages Vdata supplied to the data lines DL1 to DLd can be supplied to pixels P connected to a gate line GL supplied with a gate pulse GP.

Finally, the touch driver 800 can supply a touch driving signal to the touch electrode layer 100*b*, and can detect whether a touch is present using a touch sensing signal received from the touch electrode layer 100*b*.

Figure 6:
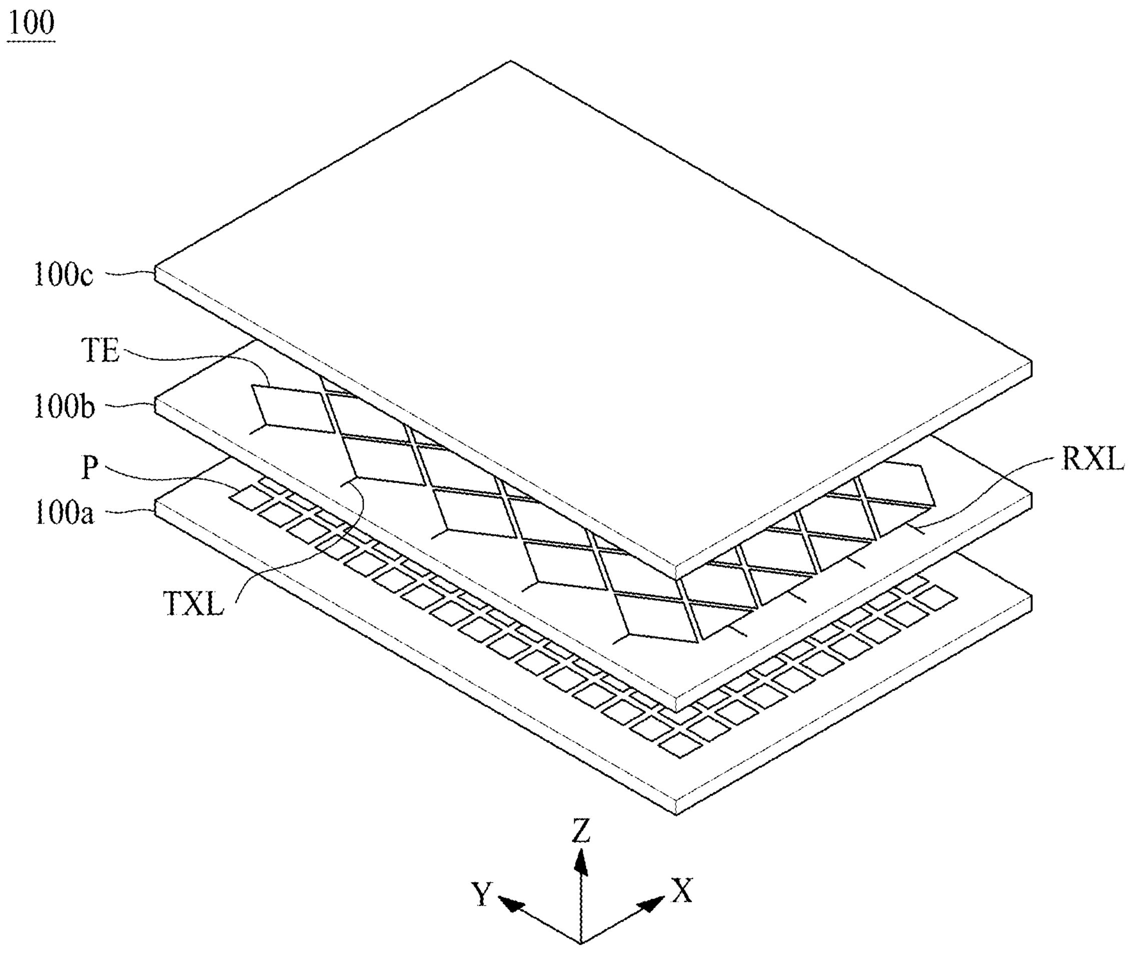
FIG. 6 is an exemplary diagram illustrating a structure of a light emitting display panel applied to a light emitting display apparatus according to an embodiment of the present disclosure.
Figure 7:
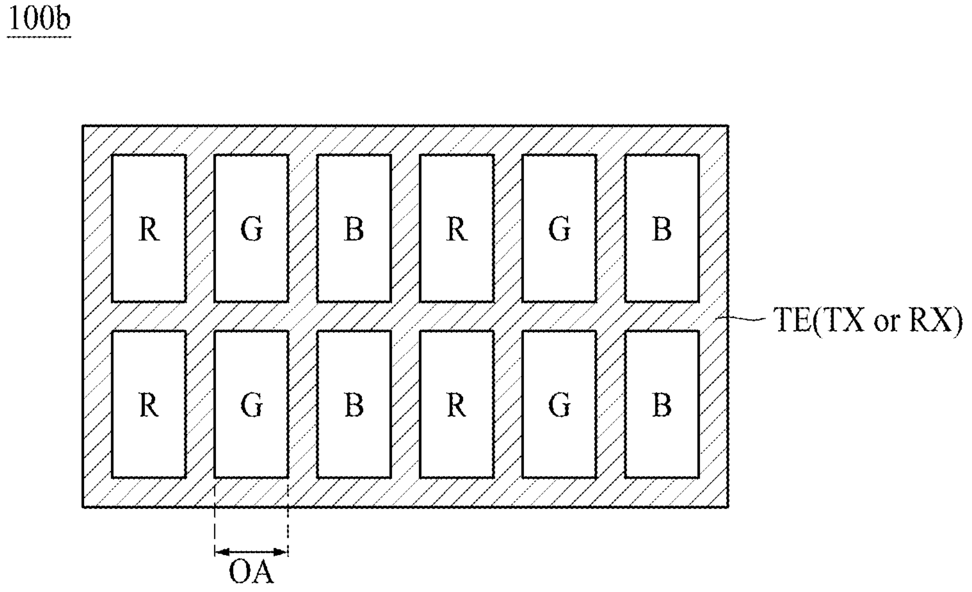
FIG. 7 is an exemplary diagram illustrating a part of a plane of a touch electrode layer illustrated in FIG. 6.
Figure 8:
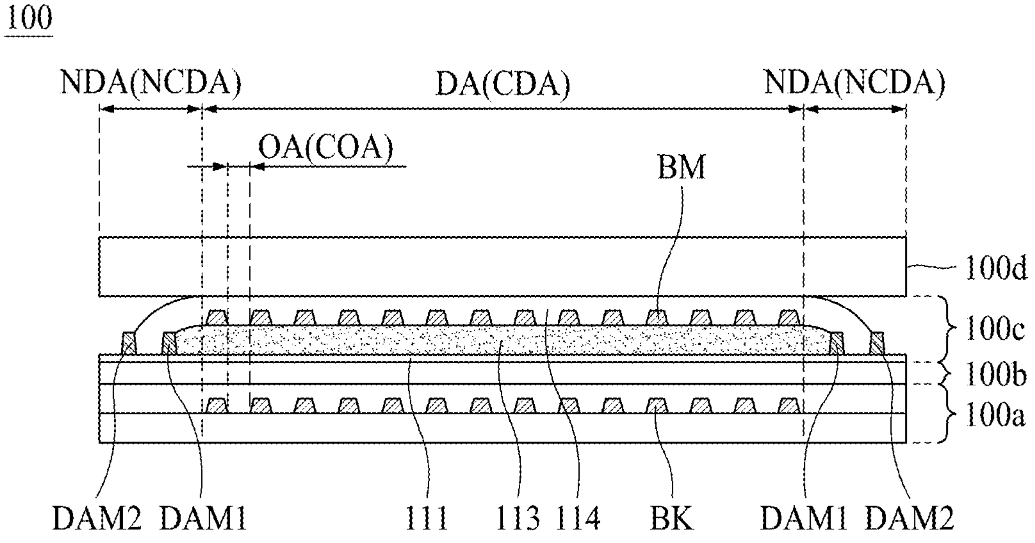
FIG. 8 is an exemplary diagram illustrating a cross-sectional surface of a light emitting display panel applied to a light emitting display apparatus according to an embodiment of the present disclosure.

FIG. 6 is an exemplary diagram illustrating a structure of a light emitting display panel applied to a light emitting display apparatus according to an embodiment of the present disclosure, FIG. 7 is an exemplary diagram illustrating a part of a plane of a touch electrode layer illustrated in FIG. 6, and FIG. 8 is an exemplary diagram illustrating a cross-sectional surface of a light emitting display panel applied to a light emitting display apparatus according to an embodiment of the present disclosure. In particular, a part of a plane of one touch electrode TE provided in the touch electrode layer 100*b* is illustrated in FIG. 7. In FIG. 7, reference numerals R, G, and B indicate areas corresponding to the red pixel, the green pixel, and the blue pixel.

As described above, a light emitting display apparatus according to an embodiment of the present disclosure includes the light emitting display panel 100.

A light emitting display apparatus according to an embodiment of the present disclosure can sense a touch, and to this end, a finger or a touch pen can be in contact with a light emitting display apparatus according to an embodiment of the present disclosure.

As illustrated in FIG. 6, the light emitting display panel 100 includes the array layer 100*a* in which pixels P are provided and an image is displayed, the touch electrode layer 100*b* provided with touch electrodes TE for sensing a touch, and the color filter layer 100*c* that transmits color light transmitted from the array layer 100*a* through the touch electrode layer 100*b*.

The array layer 100*a* can include the display area DA in which color light is output and the non-display area NDA surrounding the display area DA.

Touch electrodes TE for sensing a touch can be provided in the touch electrode layer 100*b*.

The color filter layer 100*c* is disposed on the array layer 100*a* and the touch electrode layer 100*b*. The color filter layer 100*c* can transmit color light outputted from the array layer 100*a* and transmitted through the touch electrode layer 100*b*.

First, the array layer 100*a* can include pixels P, data lines DL1 to DLd, and gate lines GL1 to GLg. Each of the pixels P can include a light emitting device ED and the pixel driving circuit PDC. As the light is output from the light emitting devices ED, an image can be displayed on the array layer 100*a*.

For example, the array layer 100*a* can include a substrate, a pixel driving circuit layer provided on the substrate, a planarization layer covering the pixel driving circuit layer, an anode provided on the planarization layer, a bank BK covering ends of the anode, a light emitting layer covering the anode and the bank BK, a cathode covering the light emitting layer, and an encapsulation layer covering the cathode.

The pixel driving circuit layer can be provided on the substrate. The pixel driving circuit layer can include the transistors Tsw1, Tsw2, and Tdr and the capacitor Cst described with reference to FIG. 2.

That is, the transistors Tsw1, Tsw2, and Tdr and the capacitor Cst described with reference to FIG. 2 can be provided on the substrate.

The planarization layer can perform a function of flattening an upper end of the pixel driving circuit layer.

The anode can be provided on an upper surface of the planarization layer. The anode can be provided for each pixel P, and the anodes are separated from each other.

The bank BK covers the ends of the anodes. The bank BK can be formed of at least one of an organic material and an inorganic material.

Light can be output to the outside through an area that is not covered by the bank BK in the anode. In the following description, the area that is not covered by the bank BK in the anode is referred to as an opening portion OA.

For example, as illustrated in FIG. 8, an area where the bank BK is not disposed in the array layer 100*a* can be the opening portion OA. In this case, color light output from the pixels P provided in the array layer 100*a* can be transmitted toward the touch electrode layer 100*b* through the opening portions OA, and color light output from the touch electrode layer 100*b* can be output to the outside of the light emitting display panel 100 through the color filter layer 100*c* and a cover substrate 100*d*.

The light emitting layer can be provided on the anode and the bank.

The light emitting layer can be covered by the cathode.

The cathode can be covered by the encapsulation layer. The encapsulation layer can perform a function of protecting the light emitting device ED from oxygen or moisture introduced from the outside.

Next, referring to FIGS. 6 and 7, the touch electrode layer 100*b* can be disposed on the array layer 100*a* and can include touch electrodes TE.

When the touch electrode layer 100*b* uses the mutual capacitance method, some of the touch electrodes TE can be included in the touch driving electrodes, and other touch electrodes TE can be included in the touch receiving electrodes. That is, the touch electrode layer 100*b* can include the touch driving electrodes and the touch receiving electrodes.

In this case, the touch electrode layer 100*b* can be attached to the upper end of the array layer 100*a* through an adhesive, but can be formed directly on the upper end of the encapsulation layer of the array layer 100*a*.

As described above, the touch electrode layer 100*b* can include touch electrodes TE for sensing a touch. In this case, a part of the touch electrodes TE can be the touch driving electrodes TX, and another part of the touch electrodes TE can be the touch receiving electrodes RX.

For example, the touch electrode layer 100*b* can include touch driving electrodes TX provided along a first direction (e.g., an X-axis direction) of the touch electrode layer 100*b* and touch receiving electrodes RX provided along a second direction (e.g., a Y-axis direction) different from the first direction. In the following description, the first direction is indicated by the reference numeral X, and the second direction is indicated by the reference numeral Y.

In this case, each of the touch driving electrodes TX includes touch electrodes TE provided along the first direction X and connected to each other, and each of the touch receiving electrodes RX includes touch electrodes TE provided along the second direction Y and connected to each other.

The touch electrode TE configuring the touch driving electrode TX and the touch electrode TE configuring the touch receiving electrode RX can be formed in various shapes.

For example, each of the touch electrodes TE can have a mesh structure, as illustrated in FIG. 7.

For example, the touch electrode TE can be formed in an area other than an area in which the anodes are provided.

To provide an additional description, light can be output to the outside through an area which is not covered by the bank BK in the anode. The area which is not covered by the bank in the anode is referred to as the opening portion OA. Also, the touch electrode TE can be provided in an area corresponding to an outer periphery of the opening portion OA, as illustrated in FIG. 7.

That is, the touch electrode TE can be provided in an area overlapping the bank BK of the array layer 100*a*, in the touch electrode layer 100*b*.

Accordingly, the touch electrode TE can have a mesh structure.

Finally, the color filter layer 100*c* can transmit color light outputted from the array layer 100*a* and transmitted through the touch electrode layer 100*b*.

To this end, the color filter layer 100*c* can be provided on the upper end of the array layer 100*a* and the touch electrode layer 100*b*, as illustrated in FIG. 8.

However, the color filter layer 100*c* can be provided on the array layer 100*a*, or the touch electrode layer 100*b* can be provided on the color filter layer 100*c*.

Also, the light emitting display panel 100 applied to a light emitting display apparatus according to an embodiment of the present disclosure does not necessarily include the touch electrode layer 100*b*. That is, the light emitting display panel 100 can include only the array layer 100*a* and the color filter layer 100*c*.

Hereinafter, for convenience of description, a light emitting display panel including the array layer 100*a*, the touch electrode layer 100*b*, and the color filter layer 100*c*, in which the color filter layer 100*c* is provided on an upper end of the array layer 100*a* and the touch electrode layer 100*b*, will be described as an example of the light emitting display panel

100 applied to a light emitting display apparatus according to an embodiment of the present disclosure.

Figure 10:
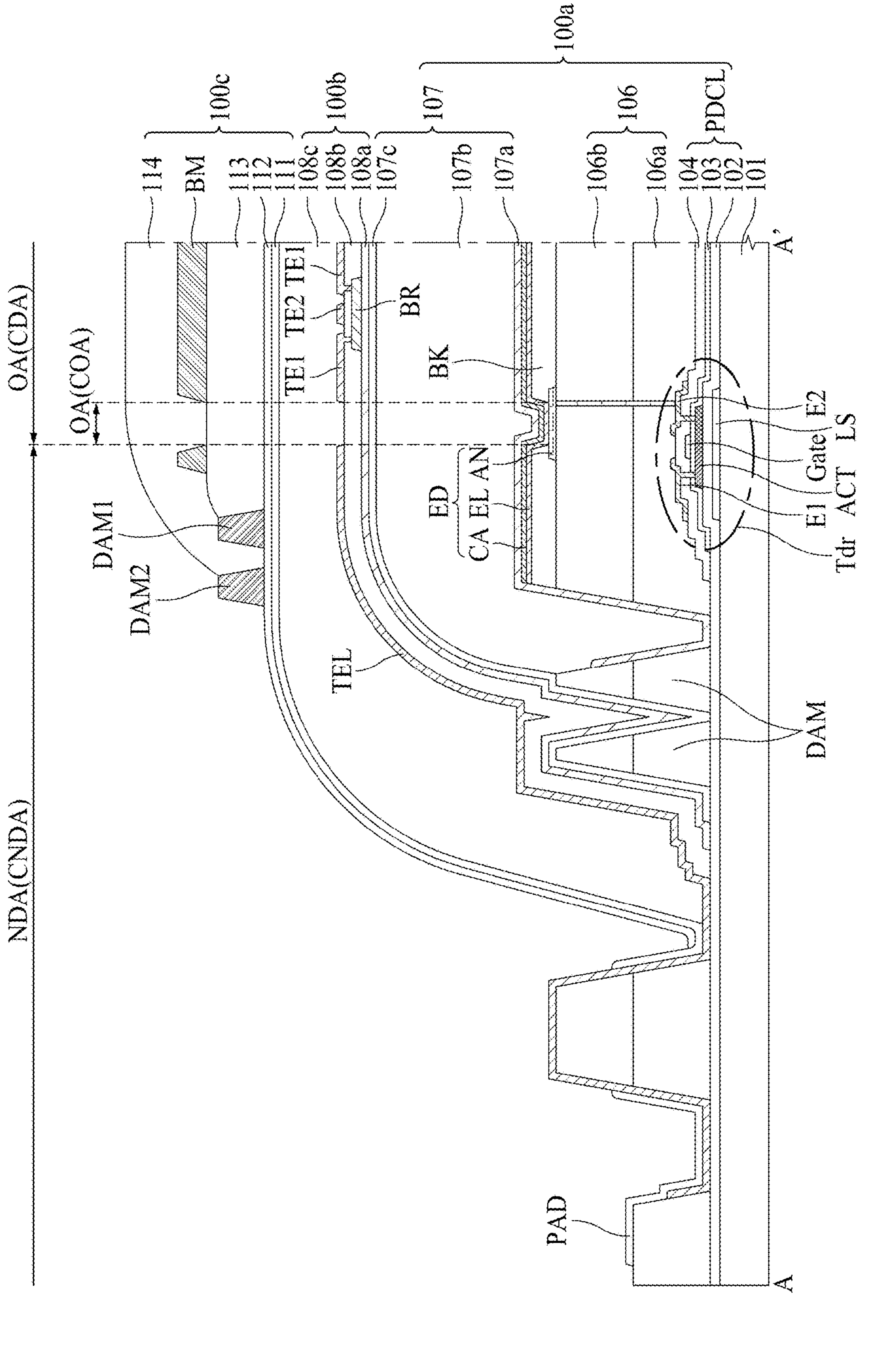
FIG. 10 is an exemplary diagram illustrating a cross-sectional surface of a light emitting display panel including a color filter layer illustrated in FIG. 9, taken along line A-A' of FIG. 9.

The array layer 100*a* is provided with the bank BK covering the ends of the anode, as illustrated in FIG. 10 described below, and the area that is not covered by the bank BK in the anode is the opening portion OA.

The bank BK distinguishes pixels and can perform a function of preventing color light generated from different pixels P from being mixed.

To this end, the bank BK can be formed using a black material capable of absorbing light.

For example, the bank BK can be formed of a mixture of a polymer-based material and Lactam black, which is a black pigment.

Touch electrodes TE are provided in the touch electrode layer 100*b*, and the touch electrodes TE can be provided in an area of the touch electrode layer 100*b* overlapping the bank BK of the array layer 100*a*, as described with reference to FIG. 7. Accordingly, the touch electrode TE may not be provided in an area corresponding to the opening portion OA in the touch electrode layer 100*b*.

However, a transparent electrode can be provided in an area of the touch electrode layer 100*b* corresponding to the opening portion OA.

Therefore, the color light transmitted through the opening portion OA of the array layer 100*a* can be transmitted to the color filter layer 100*c* through the touch electrode layer 100*b*.

That is, an area corresponding to the opening portion OA can also be provided in the touch electrode layer 100*b*.

As illustrated in FIG. 8, a black matrix BM can be provided in an area of the color filter layer 100*c* corresponding to the bank BK.

Like the bank BK, the black matrix BM can perform a function of preventing color light generated from different pixels P from being mixed.

To this end, the black matrix BM can be formed using a black material capable of absorbing light, and for example, can be formed of a mixture of a polymer-based material and Lactam black, which is a black pigment.

In the following description, an area of the color filter layer 100*c* corresponding to the display area DA of the array layer 100*a* is referred to as a color display area CDA, and an area of the color filter layer 100*c* corresponding to the non-display area NDA of the array layer 100*a* is referred to as a color non-display area NCDA.

An area of the color display area CDA that is not covered by the black matrix BM can correspond to the opening portion OA of the array layer 100*a*. Hereinafter, for convenience of description, an area of the color display area CDA not covered by the black matrix BM will be referred to as a color opening portion COA.

That is, the opening portion OA of the array layer 100*a* and the color opening portion COA of the color filter layer 100*c* overlap each other.

Therefore, color light output through the opening portion OA can be transmitted to the color filter layer 100*c* through the touch electrode layer 100*b*, and the color light transmitted from the touch electrode layer 100*b* can be output to the outside of the light emitting display panel 100 through the color opening portion COA.

When a cover substrate 100*d* is provided on an upper surface of the color filter layer 100*c*, light output through the color opening portion COA can be output to the outside through the cover substrate 100*d*.

As illustrated in FIG. 8, the color filter layer 100*c* includes a buffer 111 provided at an upper end of the array layer 100*a* and the touch electrode layer 100*b*, a first dam DAM1 provided on the buffer 111 and at the outside of the color display area CDA corresponding to the display area DA, a polarization replacement layer 113 provided within an area surrounded by the first dam DAM1, and a black matrix BM provided at an area corresponding to the bank BK provided in the array layer 100*a*.

A second dam DAM2 surrounding the first dam DAM1 can be further provided outside the first dam DAM1.

A passivation layer 114 covering the polarization replacement layer 113, the black matrix BM, and the first dam DAM1 can be provided within an area surrounded by the second dam DAM2.

A detailed structure and function of the color filter layer 100*c* will be described below in detail with reference to FIGS. 9 to 12.

Figure 9:
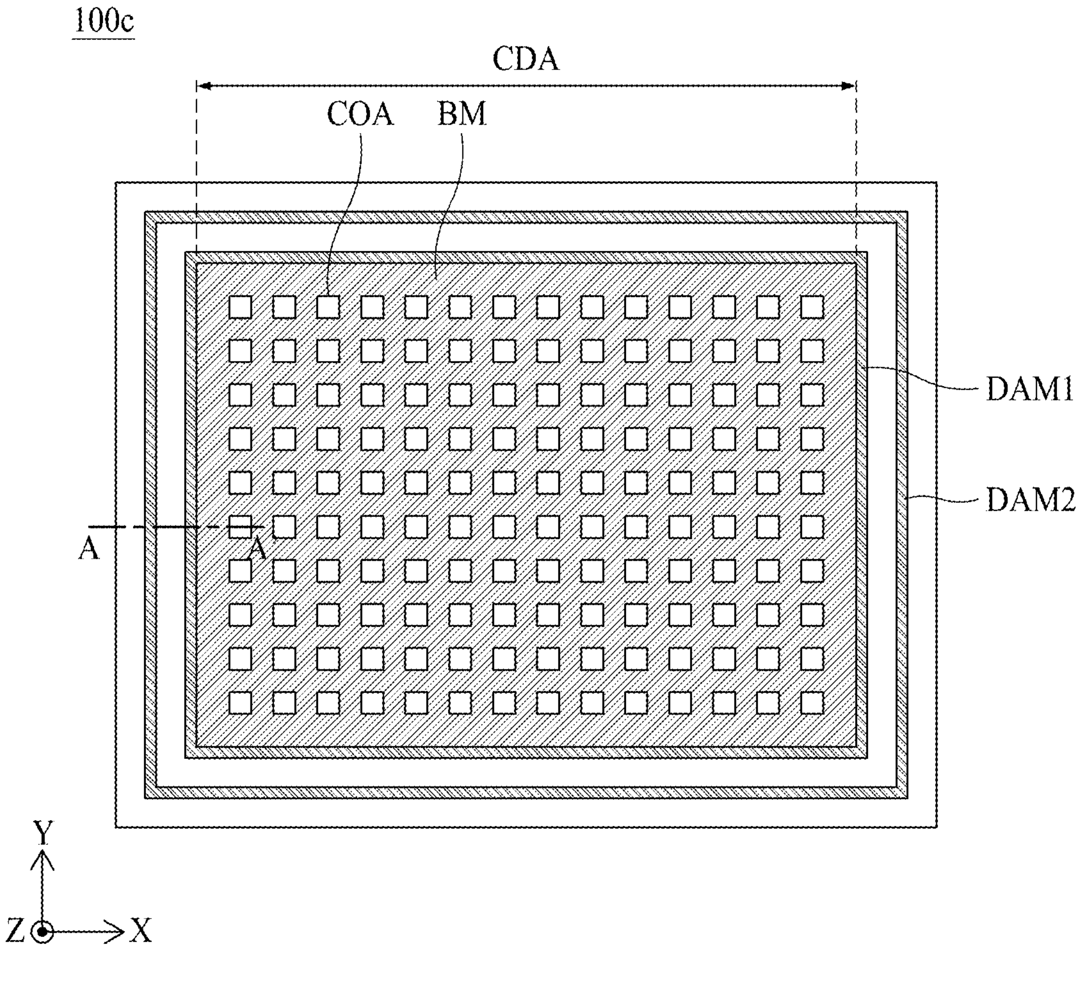
FIG. 9 is a plan view of a color filter layer applied to a light emitting display apparatus according to an embodiment of the present disclosure.
Figure 11:
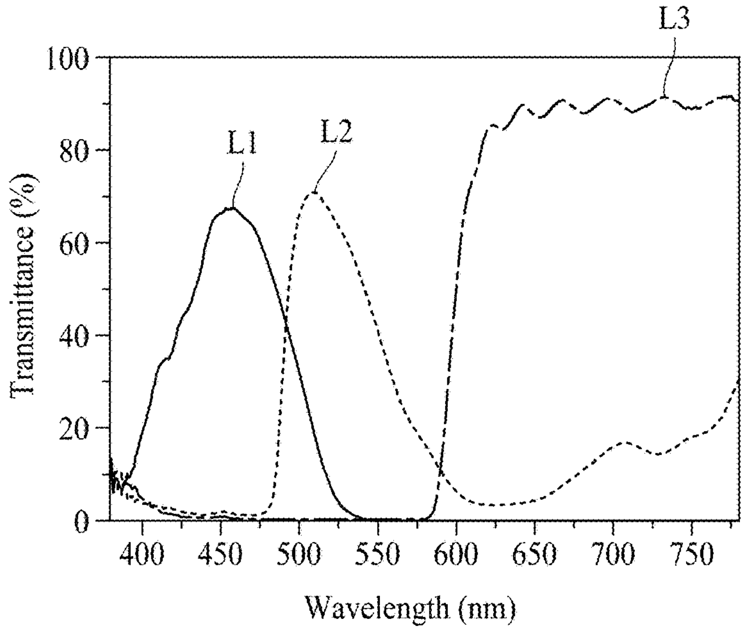
FIG. 11 is an exemplary diagram illustrating light transmitting spectra of a red color filter, a green color filter, and a blue color filter applied to a conventional light emitting display apparatus.
Figure 12:
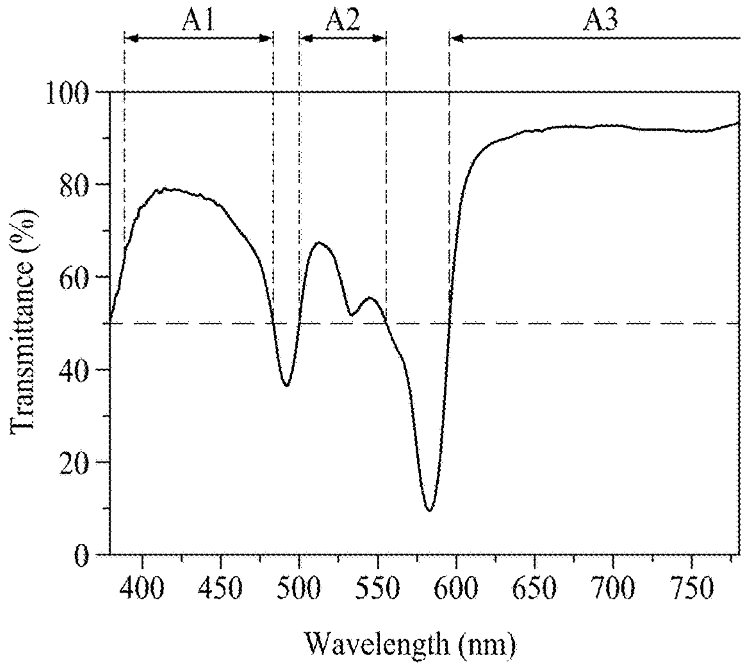
FIG. 12 is an exemplary diagram illustrating a light transmitting spectrum of a color filter layer applied to a light emitting display apparatus according to an embodiment of the present disclosure.

FIG. 9 is a plan view of a color filter layer applied to a light emitting display apparatus according to an embodiment of the present disclosure, FIG. 10 is an exemplary diagram illustrating a cross-sectional surface of a light emitting display panel including a color filter layer illustrated in FIG. 9, taken along line A-A' of FIG. 9, FIG. 11 is an exemplary diagram illustrating light transmitting spectra of a red color filter, a green color filter, and a blue color filter applied to a conventional light emitting display apparatus, and FIG. 12 is an exemplary diagram illustrating a light transmitting spectrum of a color filter layer applied to a light emitting display apparatus according to an embodiment of the present disclosure. In the following descriptions, details that are the same as or similar to details described with reference to FIGS. 1 to 8 are omitted or briefly described.

First, the array layer 100*a* can include a substrate 101, a pixel driving circuit layer PDCL, a first planarization layer 106*a*, a second planarization layer 106*b*, a light emitting device ED, and an encapsulation layer 107, as illustrated in FIG. 10.

In this case, the pixel driving circuit layer PDCL, the first planarization layer 106*a*, the second planarization layer 106*b*, the light emitting device ED, and the encapsulation layer 107 can be provided in the display area DA in which an image is displayed.

The substrate 101 can be formed of any one of various kinds of plastic substrates or can be formed of a glass substrate.

For example, the substrate 101 can be formed of an organic layer such as polyimide.

The pixel driving circuit layer PDCL including pixel driving circuits PDC can be provided in the display area DA of the substrate 101.

The pixel driving circuit layer PDCL can include the transistors Tsw1, Tsw2, and Tdr and the capacitor Cst described with reference to FIG. 2.

That is, the transistors Tsw1, Tsw2, and Tdr and the capacitor Cst described with reference to FIG. 2 can be provided on the substrate 101.

For example, in FIG. 10, the array layer 100*a* including only the driving transistor Tdr in the pixel driving circuit layer PDCL is illustrated. However, various transistors and capacitors can be further provided in the pixel driving circuit layer PDCL in addition to the driving transistor Tdr.

The pixel driving circuit layer PDCL can include at least one electrode layer and at least one insulation layer.

For example, when the driving transistor Tdr includes, as illustrated in FIG. 10, a first electrode E1, a second electrode E2, an active layer ACT, a gate insulation layer 103, and a gate, the pixel driving circuit layer PDCL can include two electrode layers and three insulation layers.

For example, the two electrode layers can include a first electrode layer including the first electrode E1 and the second electrode E2 and a second electrode layer including the gate.

Also, the three insulation layers can include an array buffer 102, a gate insulation layer 103, and a gate passivation layer 104.

Light blocking plates LS can be further provided at a lower end of the active layer ACT. The light blocking plates LS can be connected to transistors included in the pixel driving circuit PDC, or can be connected to any one of the gate driver 200, the data driver 300, the control driver 400, the power supply unit 500, and the touch driver 600.

However, as illustrated in FIG. 10, the light blocking plate LS can be configured in a form of an independent island.

For example, the light blocking plate LS illustrated in FIG. 10 can be provided at a lower end of the driving transistor Tdr and can perform a function of blocking light flowing toward the active layer of the driving transistor Tdr through the substrate 101. In this case, the light blocking plate LS can be connected to any one of the first electrode E1, the second electrode E2, and the gate of the driving transistor Tdr, but may not be connected to the first electrode E1, the second electrode E2, and the gate.

The array buffer 102 can be formed of an organic material or an inorganic material, and can be formed of at least one organic material and at least one inorganic material.

The gate insulation layer 103 can be formed of an organic material or an inorganic material, and can be formed of at least one organic material and at least one inorganic material.

The gate passivation layer 104 can be formed of an organic material or an inorganic material, and can be formed of at least one organic material and at least one inorganic material.

The gate passivation layer 104, the first electrode E1, and the second electrode E2 can be covered by the first planarization layer 106*a*.

The first planarization layer 106*a* can be covered by the second planarization layer 106*b*.

The first planarization layer 106*a* and the second planarization layer 106*b* perform a function of flattening an upper surface of the pixel driving circuit layer PDCL.

The first planarization layer 106*a* and the second planarization layer 106*b* can be formed of various kinds of organic materials. The planarization layer 106 includes the first planarization layer 106*a* and the second planarization layer 106*b*.

For example, the first planarization layer 106*a* and the second planarization layer 106*b* can be formed of a polyimide PI or acrylic polymer material, and can be formed using various organic materials used to manufacture a light emitting display apparatus.

Each of the first planarization layer 106*a* and the second planarization layer 106*b* can be formed of at least one layer.

The anode configuring the light emitting device ED can be provided on the second planarization layer 106*b*.

The anode AN can be formed of a transparent metal such as indium tin oxide (ITO), can be formed of an opaque metal such as copper Cu, or can be formed of at least one transparent metal and at least one opaque metal.

The anode AN can be connected to the second terminal of the driving transistor Tdr.

The anode AN can be provided independently for each pixel P.

The bank BK can be provided between the anodes AN.

The bank BK covers the outer edges of the anodes AN, and an area of the anode AN that is not covered by the bank BK is referred to as the opening portion OA. Color light generated by the light emitting device can be output to the outside through the opening portion OA.

The bank BK can distinguish the pixels P, and can perform a function of preventing color light generated from different pixels P from being mixed.

To this end, the bank BK can be formed using a black material capable of absorbing light.

For example, the bank BK can be formed of a mixture of a polymer-based material and Lactam black, which is a black pigment.

The anodes AN and the banks BK are covered by a light emitting layer EL.

The light emitting layer EL can be provided continuously between the anodes AN, or can be provided independently like the anode AN.

The light emitting layer EL is covered by the cathode CA.

The anode AN, the light emitting layer EL, and the cathode CA form the light emitting device ED.

As described above, the light emitting device ED can output the first color light, the second color light, or the third color light.

Hereinafter, for convenience of description, a light emitting display apparatus according to an embodiment of the present disclosure will be described by using an example in which the first color light is red light, the second color light is green light, and the third color light is blue light. In this case, the red light can be output from the light emitting device ED provided in the red pixel, the green light can be output from the light emitting device ED provided in the green pixel, and the blue light can be output from the light emitting device ED provided in the blue pixel.

The light emitting layer EL can include one of an organic light emitting layer, an inorganic light emitting layer, and a quantum dot light emitting layer. Alternatively, the light emitting layer EL can include a stack or combination structure of the organic light emitting layer (or the inorganic light emitting layer) and the quantum dot light emitting layer.

The light emitting layer EL can include a hole injection layer (HIL), a hole transport layer (HTL), a hole blocking layer (HBL), an electron injection layer (EIL), an electron transport layer (ETL), an electron blocking layer (EBL), a charge generating layer (CGL), and the like.

The light emitting layer EL can be composed of layers having various stacking orders in addition to layers having the stacking order as described above in order to output color light.

An encapsulation layer 107 can be provided on the cathode CA to prevent moisture penetration.

The encapsulation layer 107 can prevent penetration of external moisture or oxygen into the light emitting device ED that is vulnerable to external moisture or oxygen. To this end, the encapsulation layer 107 can include at least one inorganic encapsulation layer and at least one organic encapsulation layer. However, a light emitting display apparatus according to an embodiment of the present disclosure is not limited thereto.

Hereinafter, an encapsulation layer including a first encapsulation layer 107*a*, a second encapsulation layer 107*b*, and a third encapsulation layer 107*c* will be described as an example of the encapsulation layer 107 applied to a light emitting display apparatus according to an embodiment of the present disclosure.

The first encapsulation layer 107*a* covers the cathode CA. The first encapsulation layer 107*a* can be formed of an inorganic material such as silicon nitride (SiNx), silicon oxide (SiOx), silicon oxynitride (SiON), or aluminum oxide ($Al_2O_3$).

The second encapsulation layer 107*b* can be formed of a non-photosensitive organic material such as an acrylic resin, an epoxy resin, a phenolic resin, a polyamide resin, a polyimide resin, and polyethylene or silicon oxycarbon (SiOC), or can be formed of a photosensitive organic material such as photoacryl, on the substrate 101 on which the first encapsulation layer 107*a* is formed, but is not limited thereto.

When the second encapsulation layer 107*b* is formed by an ink injection (or inkjet) method, at least one encapsulation layer dam DAM can be provided in the non-display area NDA to prevent the second encapsulation layer 107*b* in a liquid form from being diffused to the outside of the substrate 101. Due to the encapsulation layer dam DAM, the second encapsulation layer 107*b* may not be diffused to the outside of the substrate 101.

In this case, the first encapsulation layer 107*a* can be formed from the display area DA to the encapsulation layer dam DAM.

The encapsulation layer dam DAM can be formed simultaneously with the first and second planarization layers 106*a* and 106*b*. For example, when the first planarization layer 106*a* is formed, a lower layer of the encapsulation layer dam DAM can be formed, and when the second planarization layer 106*b* is formed, an upper layer of the encapsulation layer dam DAM can be formed. Accordingly, the encapsulation layer dam DAM can be formed in a double structure.

Accordingly, the encapsulation layer dam DAM can be formed of the same material as those of the first and second planarization layers 106*a* and 106*b*. However, the structure of the encapsulation layer dam DAM applied to a light emitting display apparatus according to an embodiment of the present disclosure is not limited thereto.

The third encapsulation layer 107*c* is formed on the substrate 101 on which the second encapsulation layer 107*b* is formed, and can be formed to surround the upper surface, lower surface, and side surface of the second encapsulation layer 107*b* together with the first encapsulation layer 107*a*.

The first encapsulation layer 107*a* and the third encapsulation layer 107*c* can minimize or prevent external moisture or oxygen from penetrating into the light emitting device ED. The first encapsulation layer 107*a* and the third encapsulation layer 107*c* can be formed of an inorganic material capable of low-temperature deposition, such as silicon nitride (SiNx), silicon oxide (SiOx), silicon oxynitride (SiON), or aluminum oxide ($Al_2O_3$).

Second, the touch electrode layer 100*b* can be provided on the encapsulation layer 107.

The touch electrode layer 100*b* can be manufactured separately from the array layer 100*a* and then attached to the array layer 100*a* through an adhesive.

However, as illustrated in FIG. 10, the touch electrode layer 100*b* can be formed directly on the encapsulation layer 107.

The touch electrode layer 100*b* includes a first touch insulation layer 108*a* disposed on the encapsulation layer 107, a bridge electrode BR disposed on the first touch insulation layer 108*a*, a second touch insulation layer 108*b* covering the bridge electrode BR, touch electrodes TE1 and TE2 disposed on the second touch insulation layer 108*b*, and a touch passivation layer 108*c* covering the touch electrodes TE1 and TE2.

When the touch electrode layer 100*b* uses the mutual capacitance method, some of the touch electrodes TE can be included in the touch driving electrode TX to which a touch driving signal is supplied, and other touch electrodes TE can be included in the touch receiving electrode RX in which a touch sensing signal is generated.

For example, a touch electrode indicated by the reference numeral TE1 in FIG. 10 can be a touch electrode TE included in the touch driving electrode TX, and a touch electrode indicated by the reference numeral TE2 in FIG. 10 can be a touch electrode TE included in the touch receiving electrode RX.

In this case, first touch electrodes TE1 included in the touch driving electrode TX and second touch electrode TE2 included in the touch receiving electrode RX can be formed on the same layer, for example, on the second touch insulation layer 108*b*.

The touch driving electrode TX and the touch receiving electrode RX can extend in different directions. Accordingly, an area in which the touch driving electrode TX and the touch receiving electrode RX overlap can occur.

In an area where the touch driving electrode TX and the touch receiving electrode RX overlap, any one of the touch driving electrode TX and the touch receiving electrode RX can be connected through the bridge electrode BR. The bridge electrode BR can be formed on a layer different from the touch driving electrode TX and the touch receiving electrode RX, and for example, can be formed on the first touch insulation layer 108*a*.

To provide an additional description, as illustrated in FIG. 10, the first touch electrodes TE1 forming the touch driving electrode TX and the second touch electrode TE2 forming the touch receiving electrode RX can be provided on the second touch insulation layer 108*b*, and the bridge electrode BR connecting the two first touch electrodes TE1 can be covered by the second touch insulation layer 108*b*.

As the two first touch electrodes TE1 are connected by the bridge electrode BR, the two first touch electrodes TE1 can function as one touch driving electrode TX.

Each of the first touch electrode TE1 and the second touch electrode TE2 can be connected to the touch driver 600 through a touch electrode line TEL. To this end, the touch electrode line TEL can extend to a pad PAD provided in the non-display area NDA.

For example, a touch electrode line TEL connected to the first touch electrode TE1 can be the touch driving electrode line TXL described with reference to FIG. 1, and a touch electrode line TEL connected to the second touch electrode TE2 can be the touch receiving electrode line RXL described with reference to FIG. 1.

The first touch electrodes TE1, the second touch electrodes TE2, and the touch electrode line TEL can be covered by the touch passivation layer 108*c*, as illustrated in FIG. 10.

The first touch insulation layer 108*a* and the second touch insulation layer 108*b* can be formed of an inorganic material, and the touch passivation layer 108*c* can be formed of an organic material.

For example, the first touch insulation layer 108*a* and the second touch insulation layer 108*b* can be formed of silicon oxide (SiOx) or silicon nitride (SiNx), can be formed of metal oxide or metal nitride, or can be formed of various inorganic materials used in manufacturing a light emitting display apparatus.

Moreover, the touch passivation layer 108*c* can be formed of a polyimide (PI) or acrylic polymer material, and can be formed using various organic materials used to manufacture a light emitting display apparatus.

Third, the color filter layer 100*c* can be provided on the touch passivation layer 108*c*.

The color filter layer 100*c* can be manufactured separately from the touch electrode layer 100*b* and then attached to the touch electrode layer 100*b* through an adhesive.

However, the color filter layer 100*c* can be formed directly on the touch passivation layer 108*c*, as illustrated in FIG. 10.

The color filter layer 100*c* includes a buffer 111 provided at an upper end of the array layer 100*a* and the touch electrode layer 100*b*, a first dam DAM1 which is provided on the buffer 111 and provided at the periphery of the color display area CDA corresponding to the display area DA, a polarization replacement layer 113 provided within an area surrounded by the first dam DAM1, and a black matrix BM which is provided on the polarization replacement layer 113 and provided at an area corresponding to the bank BK provided in the array layer 100*a*.

The buffer 111 can be formed of the same material as the array buffer 102, but is not limited thereto. For example, the buffer 111 can be formed of an organic material or an inorganic material, and can be formed of at least one organic material and at least one inorganic material.

The first dam DAM1 can be provided outside the color display area CDA on the buffer 111. The first dam DAM1 can be formed of an organic material or an inorganic material, and can be formed of at least one organic material and at least one inorganic material.

For example, the first dam DAM1 can be formed of a material similar to that of the bank BK. That is, the first dam DAM1 can be formed of a mixture of a polymer-based material and Lactam black, which is a black pigment.

As illustrated in FIG. 9, the first dam DAM1 can be provided outside the color display area CDA so as to surround the color display area CDA.

The polarization replacement layer 113 can be provided inside the first dam DAM1.

The polarization replacement layer 113 can transmit the first color light, the second color light, and the third color light transmitted from the array layer 100*a*. That is, the polarization replacement layer can function as a color filter.

Therefore, even if a separate color filter is not provided, the first color light, the second color light, and the third color light among the color light transmitted from the array layer 100*a* can be output to the outside through the polarization replacement layer 113.

Accordingly, a color image can be displayed.

Also, the polarization replacement layer 113 can perform a function of blocking external light that is reflected by the anode AN after being introduced from the outside and then directed back to the polarization replacement layer 113.

That is, external light reflected by the anode AN after being introduced from the outside and directed back to the polarization replacement layer 113 is blocked by the polarization replacement layer 113. Accordingly, light reflected by the anode AN cannot be reflected in the direction toward the cover substrate 100*d*.

To provide an additional description, in order for the light emitting display panel to be shown in a black when a light emitting display apparatus is turned off and thus an image is not displayed from the light emitting display panel, a polarizing plate can be attached to the light emitting display panel.

Moreover, color filters can be provided at an upper end of the light emitting devices to implement a black screen without using a polarizing plate. For example, a red color filter can be provided in a red pixel, a green color filter can be provided in a green pixel, and a blue color filter can be provided in a blue pixel.

That is, the external light that is reflected by the anode AN after being introduced through the color filter from the outside and then directed back to the color filter again can be blocked by the color filter. Accordingly, the external light may not be reflected to the outside of the light emitting display panel. Therefore, when the light emitting display panel is turned off, the display area of the light emitting display panel can be displayed in a black screen. However, in order to provide at least three color filters to block the reflection of the external light, at least three masks are required, and accordingly, the manufacturing cost of a light emitting display apparatus can be increased.

A light emitting display apparatus according to an embodiment of the present disclosure uses the polarization replacement layer 113 that can replace the color filters and the polarizing plate. That is, the polarization replacement layer 113 can block external light that is reflected by the anode AN after being introduced from the outside and then directed toward the cover substrate 100*d* again. Accordingly, when the light emitting display panel is turned off, the display area of the light emitting display panel can be represented as a black screen.

That is, according to a light emitting display apparatus according to an embodiment of the present disclosure, at least three color filters can be replaced with the polarization replacement layer 113, thereby simplifying the manufacturing process of a light emitting display apparatus and reducing the manufacturing cost of a light emitting display apparatus.

The polarization replacement layer 113 can be formed of a material based on, for example, photo-acryl. Also, the polarization replacement layer 113 can be formed using, for example, a material having a viscosity of about 10 to 20 cps.

In this case, two kinds of light-absorbing dyes can be added to the polarization replacement layer 113 in order to adjust a transmittance of the wavelength band of 585 nm and a transmittance of the wavelength band of 490 nm.

Moreover, a pigment for cutting wavelengths of 380 nm or less and 780 nm or more can be added to the polarization replacement layer 113.

In this case, the total content ratio of the pigment and the dye can be adjusted not to exceed 15%. For example, when the total content ratio of the pigment and the dye is 15% or more, it may be difficult to perform an inkjet process.

The polarization replacement layer 113 can be formed in a liquid state and then provided on the buffer 111 by using an inkjet injection method.

In this case, the first dam DAM1 can perform a function of preventing the polarization replacement layer 113 sprayed in a liquid state from being diffused to the outside of the color filter layer 100*c*.

Because the polarization replacement layer 113 is provided at an upper end of the buffer 111 by using the inkjet injection method, and there is no structure with a curve like a black matrix BM between the buffer 111 and the polarization replacement layer 113, a lower surface of the polarization replacement layer 113 can be formed to be planar, and the polarization replacement layer 113 can have a uniform thickness as a whole.

Therefore, the transmittance of the color light transmitted from the array layer 100*a* can be increased, and the transmittance in different regions of the polarization replacement layer 113 can be uniform.

The black matrix BM can be provided on the polarization replacement layer 113 and in an area corresponding to the banks BK.

The black matrix BM can be formed of a material similar to that of the bank BK. That is, the black matrix BM can be formed of a mixture of a polymer-based material and Lactam black, which is a black pigment.

The black matrix BM can be formed in an area in which the black matrix BM overlaps the bank BK.

Therefore, just as the opening portion OA is formed by the bank BK, a color opening portion COA can be formed in the black matrix BM, as illustrated in FIGS. 9 and 10.

That is, a color light generated from a light emitting device ED of the array layer 100*a* is transmitted to the touch electrode layer 100*b* through the opening portion OA, and the color light transmitted from the touch electrode layer 100*b* can be output to the outside through the color opening portion COA of the color filter layer 100*c*.

In this case, the touch electrode TE may not be provided in an area corresponding to the opening portion OA, or a transparent touch electrode TE can be provided in the area corresponding to the opening portion OA. The transparent touch electrode TE can be formed of, for example, a transparent metal such as an indium tin oxide (ITO).

The color filter layer 100*c* can further include a second dam DAM2 which is provided on the buffer 111 and at the outside of the first dam DAM1 and a passivation layer 114 which covers the polarization replacement layer 113 and the black matrix BM and is provided inside the second dam DAM2.

The second dam DAM2 can be formed of an organic material or an inorganic material, and can be formed of at least one organic material and at least one inorganic material.

For example, the second dam DAM2 can be formed of a material similar to that of the bank BK. That is, the second dam DAM2 can be formed of a mixture of a polymer-based material and Lactam black, which is a black pigment The second dam DAM2 can be provided outside the first dam DAM1 to surround the first dam DAM1, as illustrated in FIG. 9.

The passivation layer 114 can be formed of a polyimide (PI) or acrylic polymer material, and can be formed using various organic materials used to manufacture a light emitting display apparatus.

The passivation layer 114 can be formed in a liquid state and then sprayed on the polarization replacement layer 113 and the black matrix BM by using the inkjet injection method.

In this case, the second dam DAM2 can perform a function of preventing the passivation layer 114 sprayed in a liquid state from being diffused to the outside of the color filter layer 100*c*.

The polarization replacement layer 113 can include acrylic.

As described above, the polarization replacement layer 113 can perform a function of blocking external light that is reflected by the anode AN after being introduced from the outside and then directed back to the polarization replacement layer 113, and accordingly, external light may not be reflected from the light emitting display panel 100.

Also, the polarization replacement layer 113 can perform a function of a color filter, for example, transmitting color light transmitted from the array layer 100*a*.

That is, the polarization replacement layer 113 can perform a function of transmitting light of a wavelength band corresponding to the first color light, light of a wavelength band corresponding to the second color light, and light of a wavelength band corresponding to the third color light.

Therefore, even if a separate color filter is not provided, the first color light, the second color light, and the third color light transmitted from the array layer 100*a* can be output to the outside through the polarization replacement layer 113. Accordingly, a color image can be displayed.

To this end, the polarization replacement layer 113 can be formed to have a light transmission spectrum as illustrated in FIG. 12, and can be formed of, for example, a material including acrylic.

For example, each of the pixels P provided in the array layer 100*a* can output the first color light, the second color light, or the third color light.

In this case, the polarization replacement layer 113 can transmit the first color light, the second color light, and the third color light transmitted from the array layer 100*a*.

Hereinafter, for convenience of description, a light emitting display apparatus according to an embodiment of the present disclosure will be described by using an example in which the first color light is red light, the second color light is green light, and the third color light is blue light. In this case, the red light can be output from a light emitting device ED provided in the red pixel, the green light can be output from a light emitting device ED provided in the green pixel, and the blue light can be output from a light emitting device ED provided in the blue pixel.

When any one of blue light, green light, and red light is output from the light emitting device ED, light transmission spectra of a red color filter, a green color filter, and a blue color filter provided in a light emitting display panel are illustrated in FIG. 11. For example, in FIG. 11, reference numeral L1 represents a light transmission spectrum of the blue color filter, reference numeral L2 represents a light transmission spectrum of the green color filter, and reference numeral L3 represents a light transmission spectrum of the red color filter.

In a light emitting display apparatus according to an embodiment of the present disclosure, the polarization replacement layer 113 can be provided in the color filter layer 100*c* to transmit blue light, green light, and red light transmitted from the array layer 100*a* in a direction toward the cover substrate 100*d* without color filters and to prevent reflection of external light.

That is, the polarization replacement layer 113 can transmit the blue light transmitted from a light emitting device ED manufactured to output the blue light, can transmit the green light transmitted from a light emitting device ED manufactured to output the green light, and can transmit the red light transmitted from a light emitting device ED manufactured to output the red light. To this end, the polarization replacement layer 113 can be formed to have a light transmission spectrum as illustrated in FIG. 12.

For example, in the light transmission spectrum of the polarization replacement layer 113 illustrated in FIG. 12, a first region A1, a second region A2, and a third region A3 having a transmittance of 60% or more correspond to a wavelength band through which the blue light is transmitted, a wavelength band through which the green light is transmitted, and a wavelength band through which the red light is transmitted, in FIG. 11.

Therefore, blue light can be output through the polarization replacement layer 113 in a pixel P provided with the light emitting device ED manufactured to output the blue light.

Also, green light can be output through the polarization replacement layer 113 in a pixel P provided with the light emitting device ED manufactured to output the green light.

Also, red light can be output through the polarization replacement layer 113 in a pixel P provided with the light emitting device ED manufactured to output the red light.

That is, blue light, green light, and red light can be output by the polarization replacement layer 113. Accordingly, an image having a normal color can be displayed on the light emitting display panel 100.

The polarization replacement layer 113 can be provided on the buffer 111 through the inkjet injection method, as described above.

In order to apply the inkjet injection method, the polarization replacement layer 113 can be formed based on an acrylic material. The viscosity of the polarization replacement layer 113 in a liquid state can be, for example, about 10 to 20 cps.

For controlling a transmittance of the wavelength band of 585 nm and a transmittance of the wavelength band of 490 nm, two kinds of light-absorbing dyes can be added to the polarization replacement layer.

A pigment for cutting wavelengths of 380 nm or less and 780 nm or more can be added to the polarization replacement layer 113.

The total content of the pigment and dye can be set not to exceed 15% of the total content of the materials configuring the polarization replacement layer.

The color filter layer 100*c* can further include a reflection reduction layer 112 provided between the buffer 111 and the polarization replacement layer 113 to reduce reflection of external light.

The reflection reduction layer 112 can perform a function of preventing light introduced from the outside of the light emitting display panel 100 from being reflected back to the outside of the light emitting display panel 100.

To provide an additional description, in a light emitting display apparatus according to an embodiment of the present disclosure, in order for the light emitting display panel to be shown in a black when a light emitting display apparatus is turned off and thus an image is not displayed from the light emitting display panel, the polarization replacement layer 113 having the light transmission spectrum as illustrated in FIG. 12 can be provided in the color filter layer 100*c*.

The reflection reduction layer 112 can be further provided in the color filter layer 100*c* to assist the function of the polarization replacement layer 113.

That is, the external light that is reflected by the anode AN after being introduced from the outside and directed toward the polarization replacement layer 113 can be blocked by the polarization replacement layer 113 and thus may not be transmitted in the direction toward the cover substrate 100*d*. However, in this case, there can be light transmitted in the direction toward the cover substrate 100*d* through the polarization replacement layer 113. In order to completely prevent the light, the reflection reduction layer 112 can be further provided.

For example, the external light that is reflected by the anode AN after being introduced from the outside and directed to the polarization replacement layer 113 should pass through the reflection reduction layer 112.

In this case, the external light introduced into the reflection reduction layer 112 can be totally reflected inside the reflection reduction layer 112 due to the refractive index difference between the reflection reduction layer 112 and the polarization replacement layer 113.

That is, the external light can be totally reflected inside the reflection reduction layer 112, and thus, may not be transmitted to the polarization replacement layer 113.

To provide an additional description, the reflection reduction layer 112 can perform a function of inducing total reflection of external light to prevent the external light from being transmitted to the polarization replacement layer 113.

External light that is not totally reflected and transmitted to the polarization replacement layer 113 can be blocked by the polarization replacement layer 113 again, and thus, the external light cannot be transmitted to the cover substrate 100*d*.

To this end, the reflection reduction layer 112 can include at least one of bismuth (Bi) and nickel (Ni).

Also, in order to perform the functions described above, the reflection reduction layer 112 can have a thickness of any one of 10 nm to 100 nm.

When the reflection reduction layer 112 is further provided on the buffer 111, the first dam DAM1, the second dam DAM2, and the polarization replacement layer 113 can be provided on the reflection reduction layer 112.

Hereinafter, a process of manufacturing the color filter layer 100*c* will be briefly described.

First, through a chemical vapor deposition (CVD) process, the buffer 111 can be provided on the touch passivation layer 108*c*.

The reflection reduction layer 112 can be formed on the buffer 111 through a sputtering process.

Through a photolithography process, the first dam DAM1 can be formed on the reflection reduction layer 112.

The polarization replacement layer 113 can be formed through the inkjet process.

The polarization replacement layer 113 can be provided within an area surrounded by the first dam DAM1.

The second dam DAM2 and the black matrix BM can be formed through a photolithography process. The second dam DAM2 is provided outside the first dam DAM1 to surround the first dam DAM1.

Finally, the passivation layer 114 can be provided on the entire surface of the color filter layer 100*c* through the inkjet process.

That is, according to the light emitting display apparatus according to an embodiment of the present disclosure, the color filter layer 100*c* can be manufactured through two photo lithography processes using a mask. Accordingly, the color filter layer 100*c* can be manufactured using a small number of masks compared to the prior art. Accordingly, the manufacturing process of a light emitting display apparatus can be simplified, and the manufacturing cost of a light emitting display apparatus can be reduced.

Moreover, according to a light emitting display apparatus according to an embodiment of the present disclosure, after the polarization replacement layer 113 is formed through the inkjet process, the black matrix BM can be provided on the polarization replacement layer 113.

Therefore, because the thickness of the polarization replacement layer 113 can be uniform, compared to the prior art, the problem of stains can be reduced, and the luminance uniformity of the color filter layer 100*c* can be improved.

The features of the light emitting display apparatus according to an embodiment of the present disclosure are briefly summarized as follows.

A light emitting display apparatus according to an embodiment of the present disclosure includes an array layer including a display area in which color light is output and a non-display area surrounding the display area; and a color filter layer provided on the array layer and transmitting color light transmitted from the array layer, wherein the color filter layer includes: a buffer provided on the array layer; a first dam provided on the buffer and provided outside a color display area corresponding to the display area; a polarization replacement layer provided inside the first dam; and a black matrix provided on the polarization replacement layer and provided in an area corresponding to a bank provided in the array layer.

The color filter layer further includes: a second dam provided on the buffer and outside the first dam; and a passivation layer covering the polarization replacement layer and the black matrix and provided inside the second dam.

The polarization replacement layer includes acrylic.

The color filter layer further includes a reflection reduction layer provided between the buffer and the polarization replacement layer and reducing reflection of external light.

The reflection reduction layer includes at least one of bismuth (Bi) and nickel (Ni).

The first dam and the polarization replacement layer are provided on the reflection reduction layer.

The polarization replacement layer transmits color light transmitted from the array layer.

At least three pixels provided in the array layer output different color lights.

The polarization replacement layer transmits at least three color lights with different wavelength bands and blocks external light reflected through the array layer after being introduced from the outside.

A light emitting display apparatus according to an embodiment of the present disclosure further includes a touch electrode layer provided between the array layer and the color filter layer and provided with touch electrodes.

The bank surrounds edges of anodes configuring light emitting devices provided in the array layer and includes a black material.

The reflection reduction layer totally reflects external light reflected through the array layer after being introduced from the outside.

According to the light emitting display apparatus according to an embodiment of the present disclosure, a process of forming color filters having at least three colors can be omitted. Accordingly, the manufacturing process of a light emitting display apparatus can be simplified.

According to the light emitting display apparatus according to an embodiment of the present disclosure, the black matrix can be provided on the polarization replacement layer performing a function of a color filter. Therefore, the thickness of the polarization replacement layer can be uniform, and thus the light transmission characteristics of the polarization replacement layer can be improved.

As the light transmission characteristics of the polarization replacement layer are improved, the quality of the light emitting display apparatus can be improved.

The light emitting display apparatus according to the present disclosure can be applied to all electronic devices including a light emitting display panel. For example, the light emitting display apparatus according to the present disclosure can be applied to a virtual reality (VR) device, an augmented reality (AR) device, a mobile device, a video phone, a smart watch, a watch phone or a wearable device, foldable device, rollable device, bendable device, flexible device, curved device, electronic notebook, e-book, PMP (portable multimedia player), PDA (personal digital assistant), MP3 player, mobile medical device, desktop PC, laptop PC, netbook computer, workstation, navigation, car navigation, vehicle display devices, televisions, wall paper display devices, signage devices, game devices, laptops, monitors, cameras, camcorders, and home appliances.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the light emitting display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display apparatus, comprising:
an array layer including a display area in which color light is output and a non-display area surrounding the display area; and
a color filter layer provided on the array layer and transmitting color light transmitted from the array layer,
wherein the color filter layer includes:
a buffer provided on the array layer;
a first dam provided on the buffer and provided outside a color display area corresponding to the display area;
a polarization replacement layer provided inside the first dam; and
a black matrix provided on the polarization replacement layer and provided in an area corresponding to a bank provided in the array layer.

2. The light emitting display apparatus of claim 1, wherein the color filter layer further includes:
a second dam provided on the buffer and outside the first dam; and
a passivation layer covering the polarization replacement layer and the black matrix and provided inside the second dam.

3. The light emitting display apparatus of claim 1, wherein the polarization replacement layer includes acrylic.

4. The light emitting display apparatus of claim 1, wherein the color filter layer further includes a reflection reduction layer provided between the buffer and the polarization replacement layer and reducing reflection of external light.

5. The light emitting display apparatus of claim 4, wherein the reflection reduction layer includes at least one of bismuth (Bi) and nickel (Ni).

6. The light emitting display apparatus of claim 4, wherein the first dam and the polarization replacement layer are provided on the reflection reduction layer.

7. The light emitting display apparatus of claim 1, wherein the polarization replacement layer transmits color light transmitted from the array layer.

8. The light emitting display apparatus of claim 7, wherein at least three pixels provided in the array layer output different color lights.

9. The light emitting display apparatus of claim 7, wherein the polarization replacement layer transmits at least three color lights with different wavelength bands and blocks external light reflected through the array layer after being introduced from the outside.

10. The light emitting display apparatus of claim 1, further comprising a touch electrode layer provided between the array layer and the color filter layer and provided with touch electrodes.

11. The light emitting display apparatus of claim 1, wherein the bank surrounds edges of anodes configuring light emitting devices provided in the array layer and includes a black material.

12. The light emitting display apparatus of claim 4, wherein the reflection reduction layer totally reflects external light reflected through the array layer after being introduced from the outside.

13. The light emitting display apparatus of claim 1, wherein the array layer includes a substrate, a pixel driving circuit layer, a first planarization layer, a second planarization layer, a light emitting device and an encapsulation layer that are sequentially disposed.

14. The light emitting display apparatus of claim 13, wherein the pixel driving circuit layer is disposed in the display area and includes an array buffer, a gate insulation layer and a gate passivation layer that are sequentially disposed.

15. The light emitting display apparatus of claim 13, wherein an anode configuring the light emitting device is provided on the second planarization layer.

16. The light emitting display apparatus of claim 13, wherein the encapsulation layer includes a first encapsulation layer, a second encapsulation layer and a third encapsulation layer that are sequentially disposed, wherein the first encapsulation layer is formed from the display area to a encapsulation layer dam which is formed of a same material as those of the first and second planarization layers in the non-display area.

17. The light emitting display apparatus of claim 13, wherein the buffer is formed of a same material as the array buffer.

18. The light emitting display apparatus of claim 1, wherein the polarization replacement layer is formed using a material having a viscosity of 10 to 20 cps.

19. The light emitting display apparatus of claim 1, wherein two kinds of light-absorbing dyes are added to the polarization replacement layer.

20. The light emitting display apparatus of claim 19, wherein a pigment for cutting wavelengths of 380 nm or less and 780 nm or more is added to the polarization replacement layer, and a total content of the pigment and the dye is set not to exceed 15% of a total content of materials configuring the polarization replacement layer.

21. The light emitting display apparatus of claim 4, wherein there is a refractive index difference between the reflection reduction layer and the polarization replacement layer such that an external light introduced into the reflection reduction layer is totally reflected inside the reflection reduction layer.

* * * * *